(12) United States Patent
Iwamoto et al.

(10) Patent No.: US 8,339,015 B2
(45) Date of Patent: Dec. 25, 2012

(54) ELASTIC WAVE DEVICE AND METHOD FOR MANUFACTURING THE SAME

(75) Inventors: Takashi Iwamoto, Nagaokakyo (JP); Hajime Kando, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/343,742

(22) Filed: Jan. 5, 2012

(65) Prior Publication Data

US 2012/0098387 A1 Apr. 26, 2012

Related U.S. Application Data

(63) Continuation of application No. PCT/JP2010/059419, filed on Jun. 3, 2010.

(30) Foreign Application Priority Data

Jul. 7, 2009 (JP) .................................. 2009-160492

(51) Int. Cl.
*H03H 9/25* (2006.01)
(52) U.S. Cl. ..................... 310/313 R; 310/346; 29/25.35
(58) Field of Classification Search .............. 310/313 R, 310/346; 29/25.35
See application file for complete search history.

(56) References Cited

U.S. PATENT DOCUMENTS

| | | | |
|---|---|---|---|
| 6,445,265 B1 | 9/2002 | Wright | |
| 8,004,148 B2 * | 8/2011 | Umeda et al. | 310/313 B |
| 2004/0104272 A1 * | 6/2004 | Figuet et al. | 235/487 |
| 2007/0199186 A1 | 8/2007 | Yoshino et al. | |

FOREIGN PATENT DOCUMENTS

| | | |
|---|---|---|
| JP | 54-069048 A | 6/1979 |
| JP | 02-065519 A | 3/1990 |
| JP | 2000-156624 A | 6/2000 |
| JP | 2000-196410 A | 7/2000 |
| JP | 2002-534886 A | 10/2002 |
| JP | 2003-017967 A | 1/2003 |
| JP | 2005-354507 A | 12/2005 |
| JP | 2007-228319 A | 9/2007 |
| JP | 2008-118079 A | 5/2008 |
| JP | 2010-154315 A | 7/2010 |
| WO | 2006/114922 A1 | 11/2006 |

OTHER PUBLICATIONS

Official Communication issued in International Patent Application No. PCT/JP2010/059419, mailed on Aug. 31, 2010.

* cited by examiner

*Primary Examiner* — Thomas Dougherty
(74) *Attorney, Agent, or Firm* — Keating & Bennett, LLP

(57) ABSTRACT

An elastic wave device includes a piezoelectric thin film formed from a piezoelectric single crystal substrate by peeling, an inorganic layer formed on a rear surface of the piezoelectric thin film, an elastic layer disposed on a surface of the inorganic layer opposite to the piezoelectric thin film, and a support member adhered to a surface of the elastic layer opposite to the inorganic layer. The elastic layer reduces stress generated when the piezoelectric thin film provided with the inorganic layer and the support member are adhered to each other and has a predetermined elastic modulus. The inorganic layer is formed of a material having a higher elastic modulus than that of the elastic layer and prevents damping generated when the elastic layer is provided.

10 Claims, 5 Drawing Sheets

ELASTIC WAVE DEVICE AND METHOD FOR MANUFACTURING THE SAME

BACKGROUND OF THE INVENTION

1. Field of the Invention

The present invention relates to an elastic wave device including a thin film of a piezoelectric single crystal and a method for manufacturing the elastic wave device.

2. Description of the Related Art

In recent years, many piezoelectric devices each including a thin film of a piezoelectric single crystal have been developed. In the piezoelectric device including a piezoelectric thin film as described above, a support member supporting the piezoelectric thin film is necessary in practical use. As disclosed in Japanese Unexamined Patent Application Publication No. 2007-228319 and Japanese Unexamined Patent Application Publication No. 2003-17967, the support member as described above is provided on one primary surface of the piezoelectric thin film.

In addition, as one of methods for forming a composite piezoelectric substrate formed of the piezoelectric thin film and the support member as described above, for example, a smart cut method was used. In the smart cut method, an ion-implanted layer is formed by performing ion implantation in one primary surface of a piezoelectric substrate having a bondable thickness. Next, a support member separately formed is bonded to the primary surface at an ion-implanted layer side of the piezoelectric substrate in which the ion-implanted layer is formed, for example, by using activation bonding or affinity bonding. Subsequently, the piezoelectric thin film is peeled away from the piezoelectric substrate by heating the ion-implanted layer.

Incidentally, as a method for bonding a support member to a substrate which forms a thin film as described above is by peeling, as disclosed in Japanese Unexamined Patent Application Publication No. 2008-118079, although not for a composite piezoelectric substrate, the structure has been proposed in which an elastic body is provided between a single crystal silicon substrate and a support member.

However, when the piezoelectric substrate and the support member are directly bonded to each other as disclosed in Japanese Unexamined Patent Application Publication No. 2007-228319 and Japanese Unexamined Patent Application Publication No. 2003-17967, the difference in coefficient of linear expansion between the piezoelectric substrates and the support member cannot be ignored, and hence the degree of freedom of selecting a material of the support member will be remarkably limited. In addition, in order not to apply an unnecessary stress to the piezoelectric substrate during bonding, the bonding conditions must be strictly set, for example, so as to avoid irregularities greater than a predetermined level and to prevent particles from being present on a bonding surface. Hence, concomitant with an increase in process load, the process control becomes difficult.

On the other hand, as disclosed in Japanese Unexamined Patent Application Publication No. 2008-118079, when the elastic body is provided between the semiconductor substrate and the support member, various troubles as described above generated when the piezoelectric substrate and the support member are bonded to each other can be suppressed. However, since an elastic body having a low elastic modulus is bonded to the piezoelectric substrate, damping is unfavorably generated, and the performance as the piezoelectric device is degraded. In particular, in the case of an elastic wave device using a piezoelectric thin film, the damping as described above must be avoided since the performance is seriously degraded thereby.

SUMMARY OF THE INVENTION

Therefore, preferred embodiments of the present invention provide an elastic wave device which prevents various troubles generated during bonding as described above and which structurally causes no degradation in performance and a method for manufacturing the elastic wave device described above.

According to a preferred embodiment of the present invention, an elastic wave device includes a piezoelectric thin film on which an IDT electrode is provided and a support member provided at one primary surface side of this piezoelectric thin film. In this elastic wave device, an inorganic layer and an elastic layer are provided between the piezoelectric thin film and the support member. The inorganic layer is disposed on one primary surface of the piezoelectric thin film, and the elastic layer is disposed on a surface of the inorganic layer opposite to the piezoelectric thin film. In this case, the inorganic layer is preferably made of a material having a high elastic modulus (hereinafter, the elastic modulus indicates "Young's modulus" unless otherwise particularly noted) and a high hardness as compared to those of the elastic layer.

In this structure, since a composite layer including the piezoelectric thin film and the inorganic layer is bonded to the support member with the elastic layer provided therebetween, a material of the support member having a thickness larger than that of each of the piezoelectric thin film and the inorganic layer can be selected without considering the difference in coefficient of linear expansion from the piezoelectric thin film. In addition, since the inorganic layer is provided between the elastic layer and the piezoelectric thin film, damping caused by the elastic layer is not generated.

In addition, in the elastic wave device of a preferred embodiment of the present invention, an inorganic filler is included in the elastic layer.

In this structure, since the inorganic filler is included in the elastic layer, besides an increase in heat conductivity of the elastic layer and a decrease in coefficient of linear expansion thereof, the elastic modulus can also be increased. Hence, various characteristics, such as power durability and temperature characteristics, of the elastic wave device can be improved.

In addition, in the elastic wave device according to a preferred embodiment of the present invention, a material having a higher heat conductivity than that for the piezoelectric thin film is preferably used for the inorganic layer.

In this structure, since heat generated in the piezoelectric thin film is effectively transmitted to the inorganic layer, the power durability of the elastic wave device can be improved.

In addition, in the elastic wave device according to a preferred embodiment of the present invention, a material having a higher heat conductivity than that for each of the piezoelectric thin film and the inorganic layer is used for the elastic layer.

In this structure, since heat is effectively transmitted from the piezoelectric thin film to the elastic layer via the inorganic layer, the power durability can be further improved.

In addition, in the elastic wave device according to a preferred embodiment of the present invention, a material having a lower coefficient of thermal expansion than that for the piezoelectric thin film is preferably used for the inorganic layer.

In this structure, since the inorganic layer is not likely to be deformed as compared to the piezoelectric thin film, the inorganic layer holds the piezoelectric thin film, and hence the temperature characteristics as the elastic wave device can be improved.

In addition, in the elastic wave device according to a preferred embodiment of the present invention, the piezoelectric thin film is preferably made of a material containing a Group I element.

In this structure, when a material containing a Group I element, such as LT, LN, or LBO, is preferably used for the piezoelectric thin film, since the cleavability thereof is high, the piezoelectric thin film becomes liable to be fractured. However, since the elastic layer and the inorganic layer are provided between the support member and the piezoelectric thin film as described above, the support member is indirectly bonded to the piezoelectric thin film, and in particular, a fraction of devices that become defective during bonding can be reduced.

In addition, another preferred embodiment of the present invention relates to a method for manufacturing the elastic wave device described above. This method for manufacturing an elastic wave device includes an ion implantation step, an inorganic layer formation step, an elastic layer disposing step, a laminating step, and a peeling step. In the ion implantation step, ions are implanted in a piezoelectric substrate to form an ion-implanted layer. In the inorganic layer formation step, an inorganic layer is directly formed on one primary surface of the piezoelectric substrate at an ion-implanted layer side. In the elastic layer disposing step, an elastic layer is disposed on a surface of the inorganic layer opposite to the piezoelectric substrate. In the laminating step, a support member is laminated to the elastic layer. In the peeling step, a piezoelectric thin film is formed from the piezoelectric substrate in which the ion-implanted layer is formed by peeling.

In this manufacturing method, the structure formed of the piezoelectric thin film, the inorganic layer, the elastic layer, and the support member can be easily manufactured. In this manufacturing method, since the inorganic layer is directly formed on the piezoelectric layer without using a bonding technique, problems generated in the past when the piezoelectric substrate is bonded to the support member do not occur. In addition, when a composite layer formed of the piezoelectric substrate, the inorganic layer, and the elastic layer is laminated to the support member, since the inorganic layer functions as a protective layer for the piezoelectric substrate, and the elastic layer functions as a buffer layer and a step reducing layer, the troubles and characteristic problems generated in the bonding as described above do not occur. Accordingly, a highly reliable elastic wave device having excellent characteristics can be easily manufactured with high yield.

In addition, another preferred embodiment of the present invention relates to a method for manufacturing the elastic wave device described above. This method for manufacturing an elastic wave device includes an ion implantation step, an inorganic layer formation step, an elastic layer disposing step, a laminating step, and a peeling step. In the ion implantation step, ions are implanted in a piezoelectric substrate to form an ion-implanted layer. In the inorganic layer formation step, an inorganic layer is directly formed on one primary surface of the piezoelectric substrate at an ion-implanted layer side. In the elastic layer disposing step, an elastic layer is disposed on a surface of a support member. In the laminating step, the inorganic layer is laminated to the elastic layer. In the peeling step, a piezoelectric thin film is formed from the piezoelectric substrate in which the ion-implanted layer is formed by peeling.

Although in the previous method described above, the elastic layer is formed at a piezoelectric substrate and a inorganic layer side and is then laminated to the support member, in this manufacturing method, the elastic layer preferably is formed at a support member side, and a first composite layer formed of the piezoelectric substrate and the inorganic layer and a second composite layer formed of the support member and the elastic layer are laminated to each other. By performing the steps as described above, a heat treatment at a temperature higher than a peeling temperature for the ion-implanted layer can be performed on the elastic layer before the laminating step. Accordingly, for example, an annealing (removal of an unnecessary solvent) treatment of the elastic layer can be easily performed, and the reliability can be further improved.

In addition, in the method for manufacturing an elastic wave device according to a preferred embodiment of the present invention, the laminating step is performed in a reduced-pressure atmosphere.

In this manufacturing method, since the laminating step is performed in a reduced-pressure atmosphere, avoids generated in the vicinity of the interface of the elastic layer are prevented and minimized, and the reliability can be improved. In addition, since the heat treatment temperature can be decreased, adverse influences, such as degradation in cleavability of the piezoelectric substrate and degradation in characteristics thereof, caused by the heat treatment can be prevented.

In addition, in the method for manufacturing an elastic wave device according to a preferred embodiment of the present invention, the inorganic layer formation step is performed in a reduced-pressure atmosphere.

In this manufacturing method, voids generated in the vicinity of the interface between the inorganic layer and the piezoelectric substrate are prevented, and hence a dense interface can be formed.

According to various preferred embodiments of the present invention, the functional portions of the elastic wave device prevent various troubles generated in the bonding between the support member and the piezoelectric substrate from which the piezoelectric thin film is formed, and hence, the performance as the elastic wave device is not degraded. Hence, an elastic wave device can be realized which has a higher design degree of freedom than that in the past, which can be formed by easy process control, and which has excellent characteristics and reliability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
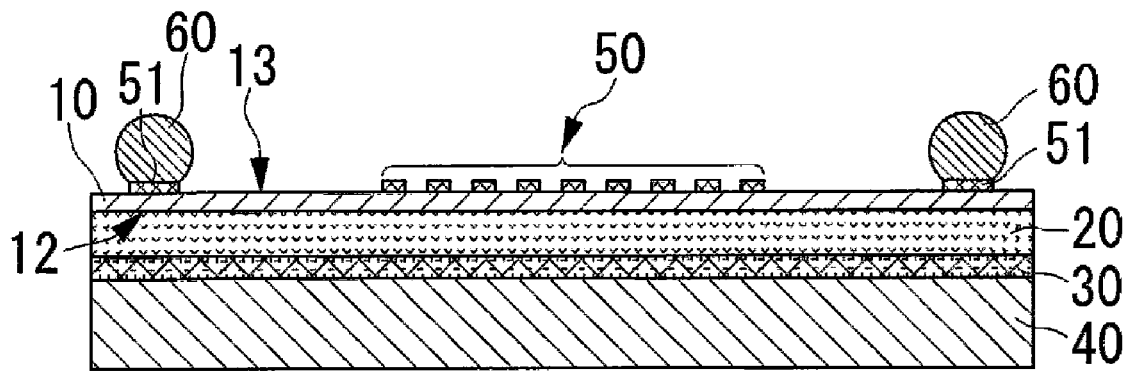
FIG. 1 is a side cross-sectional view showing the structure of an elastic wave device according to a first preferred embodiment of the present invention.

An elastic wave device according to a first preferred embodiment of the present invention and a method for manufacturing the elastic wave device will be described with reference to the drawings. In addition, in the present preferred embodiment, a surface acoustic wave device will be described by way of example. FIG. 1 is a side cross-sectional view showing the structure of the elastic wave device according to the present preferred embodiment. An elastic wave device includes a piezoelectric thin film 10 made of a piezoelectric single crystal, such as LT, preferably having a thickness of approximately 1 μm, for example. In addition, for the piezoelectric thin film 10, besides LT, for example, a material, such as LN, LBO ($Li_2B_4O_7$), langasite ($La_3Ga_5SiO_{14}$), KN ($KNbO_3$), or KLN ($K_3Li_2Nb_5O_{15}$), which has piezoelectricity and which can be processed by a smart cut method, is preferably used.

An IDT electrode 50, bump pads 51, and a circuit pattern (not shown) which electrically connects between the IDT electrode 50 and the bump pads 51 are formed on a surface 13 of the piezoelectric thin film 10. Furthermore, on the bump pads 51, bumps 60 for connection with other components are formed. For the IDT electrode 50, for example, Al, W, Mo, Ta, Hf, Cu, Pt, Ti, and Au may be used alone or in combination in accordance with the specification of the device, and for the bump pad 51 and lead electrodes, Al or Cu may be used.

On the other hand, an inorganic layer 20 is formed on a whole rear surface 12 of the piezoelectric thin film 10. As a material of the inorganic layer 20, for example, there may be used a material having an elastic modulus and a hardness each equivalent to or more than a predetermined value in a usage atmosphere, such as an atmosphere at a temperature in a range of about −55° C. to about +150° C., for example, in which a common piezoelectric device is used. In particular, for example, various types of metal oxides, such as a silicon oxide, a silicon nitride, an aluminum oxide, an aluminum nitride, a tantalum oxide, DLC (diamond like carbon), a magnesium oxide, and an yttrium oxide; and glass materials, such as PSG, may be used. In addition, for the inorganic layer 20, a material having a higher heat conductivity than that of the piezoelectric thin film 10 and/or a lower coefficient of linear expansion than that thereof is more preferably used.

An elastic layer 30 is formed on a whole surface of the inorganic layer 20 opposite to the piezoelectric thin film 10. As a material of the elastic layer 30, a material having a relatively low elastic modulus and hardness is preferably used. In particular, for example, a resin material, such as an epoxy resin, a polyimide resin, a benzocyclobutene resin, a cyclic olefin resin, or a liquid crystal polymer, may be used. In addition, a material having high heat resistance and chemical resistance is preferably used for the elastic layer 30, and in particular, in the case of a device to be used at a high temperature of about 300° C. or more, for example, a polyimide resin, a benzocyclobutene resin, or a liquid crystal polymer is more preferably used. In addition, the elastic layer 30 also preferably has a high heat conductivity.

Furthermore, when an inorganic filler, such as silica or alumina, is contained in the elastic layer 30, the elastic modulus, the hardness, and the heat conductivity described above can be appropriately adjusted, and furthermore, the coefficient of linear expansion can also be appropriately adjusted.

A support member 40 is laminated to a surface of the elastic layer 30 opposite to the inorganic layer 20. An inexpensive material having excellent workability is used for the support member 40. In particular, for example, Si, glass, or a ceramic, such as alumina, is used.

When the laminate structure as described above is formed, the following various types of operation effects can be obtained.

Since a composite layer of the piezoelectric thin film and the inorganic layer 20 is bonded (laminated) to the support member 40 with the elastic layer 30 provided therebetween, even if the individual interfaces are not processed to have a significantly high flatness in the bonding, steps formed, for example, by irregularities are absorbed by the elastic layer 30, and hence, a local stress caused by the bonding can be prevented from being generated in the piezoelectric thin film 10. In addition, in this case, even if particles (minimum size refuse, dust, and the like) are present on a bonding surface (laminating surface) of the support member 40 and/or a bonding surface (laminating surface) of the inorganic layer 20, steps caused by the particles can also be absorbed by the elastic layer 30, and the stress described above can be prevented from being generated.

Furthermore, since a pressure applied to a piezoelectric thin film 10 in the bonding (laminating) is reduced by the elastic layer 30, even if the piezoelectric thin film 10 has high cleavability and is in an ion implanted state, generation of chips and the like can be prevented.

In addition, since the process control conditions can be moderated as described above, the process control can be easily performed.

When the support member 40 is disposed to the piezoelectric thin film 10 with the elastic layer 30 provided therebetween, even if the difference in coefficient of linear expansion between the piezoelectric thin film 10 and the support member 40 is large, a stress caused by this difference in coefficient of linear expansion is absorbed by the elastic layer 30. Accordingly, when a material of the support member 40 is selected, since the coefficient of linear expansion is not necessarily taken into consideration, the degree of freedom of selecting a material of the support member 40 is increased. As a result, an inexpensive material can be selected, and the cost of the support member 40 having a significantly high ratio to the volume of the elastic wave device can be reduced; hence, the elastic wave device can be realized at a reasonable cost. In addition, since a material excellent in workability can also be used for the support member 40, a process load applied to the support member 40 can be reduced.

When the elastic layer 30 is in direct contact with the piezoelectric thin film 10, although damping is generated as described above, since the inorganic layer 20 having higher elastic modulus and hardness than those of the elastic layer 30 is provided between the elastic layer 30 and the piezoelectric thin film 10, damping can be prevented from being generated.

Accordingly, degradation in characteristics caused by structural factors generated by the use of the elastic layer 30 can be prevented and minimized.

As described above, by using the structure of this preferred embodiment, an elastic wave device having high reliability and excellent characteristics can be realized at a reasonable cost.

When a material having a high heat conductivity is used for the inorganic layer 20, heat generated when the piezoelectric thin film 10 is driven is transmitted to the inorganic layer 20 and is dissipated, and hence the power durability can be improved. Furthermore, when the heat conductivity of the elastic layer 30 is increased, since heat transmitted to the inorganic layer 20 can be more effectively transmitted to the elastic layer 30 and is dissipated through the elastic layer 30 and the support member 40, the power durability can be further improved.

When a material having a low coefficient of linear expansion is used for the inorganic layer 20, expansion and contraction of the piezoelectric thin film 10 caused, for example, by temperature variation can be restricted by the inorganic layer 20, and temperature characteristics as the elastic wave device can be improved.

When an inorganic filler is contained in the elastic layer 30, since the elastic modulus, the hardness, the heat conductivity, and the coefficient of linear expansion can be appropriately set, an elastic wave device in conformity with the specification of reliability and/or the specification of characteristics can be easily realized. For example, when the volume ratio of the resin to the inorganic filler is set to approximately 50:50 to 10:90, conditions which are not realized only by a resin material, such as conditions in which the coefficient of linear expansion is about 20 ppm/° C. or less, the heat conductivity is about 0.5 W/(m·K) or more, and the elastic modulus is about 1 GPa or more, for example, can be realized while the laminating strength is maintained in the bonding.

When the compositions of the inorganic layer 20 and the elastic layer 30 are further appropriately set as described above, an elastic wave device having higher reliability and more excellent characteristics can be realized at a reasonable cost.

Next, a method for manufacturing the elastic wave device described above will be described with reference to the drawings.

Figure 2:
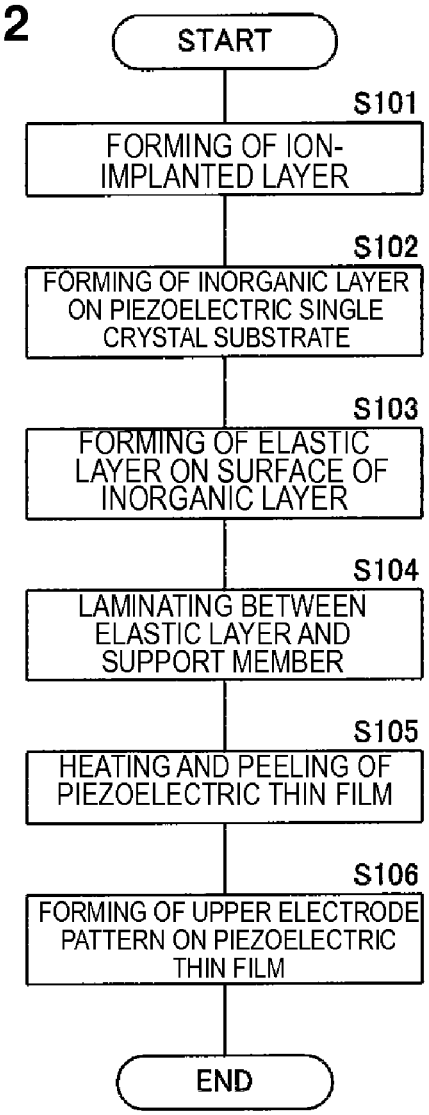
FIG. 2 is a flowchart showing a method for manufacturing the elastic wave device according to the first preferred embodiment of the present invention.

FIG. 2 is a flowchart showing a method for manufacturing an elastic wave device according to this preferred embodiment. FIGS. 3A to 4C include schematic views each showing a step of manufacturing the elastic wave device formed by the manufacturing flow shown in FIG. 2.

Figure 3A:
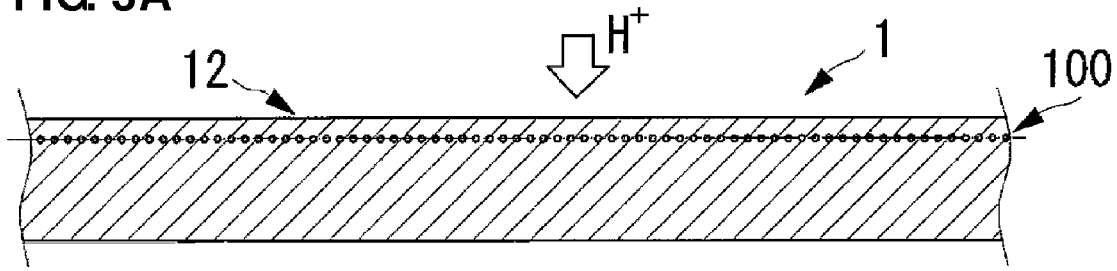
FIGS. 3A-3D include schematic views each showing a step of manufacturing the elastic wave device formed by the manufacturing flow shown in FIG. 2.

First, a piezoelectric single crystal substrate 1 having a predetermined thickness is prepared, and as shown in FIG. 3A, an ion-implanted layer 100 is formed by implanting hydrogen ions from a rear surface 12 side (FIG. 2: S101). In this step, as the piezoelectric single crystal substrate 1, a substrate in a multiple state in which a plurality of piezoelectric devices is arranged is used. In addition, for example, when an LT substrate is used for the piezoelectric single crystal substrate 1, by performing hydrogen ion implantation with, for example, a dose of about $1.0 \times 10^{17}$ atom/cm$^2$ at an accelerating energy of about 150 KeV, a hydrogen ion layer is formed at a position approximately 1 µm deep from the rear surface 12, so that the ion-implanted layer 100 is formed. In addition, the conditions of an ion implantation treatment are appropriately set in accordance with a material of the piezoelectric single crystal substrate 1 and the thickness of the ion-implanted layer 100, and for example, when the accelerating energy is set to about 75 KeV, a hydrogen ion layer is formed at a position that is about 0.5 µm deep, for example.

Figure 3B:
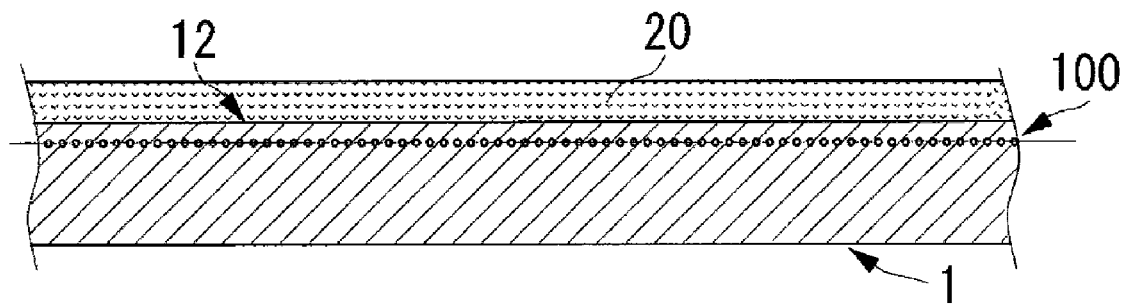

Next, as shown in FIG. 3B, the inorganic layer 20 is formed on the rear surface 12 of the piezoelectric single crystal substrate 1 (FIG. 2: S102). As a material of the inorganic layer 20, a material which satisfies the above elastic modulus, hardness, heat conductivity, and coefficient of linear expansion is used, and the thickness is appropriately set.

A bonding method is not used as a method for forming the inorganic layer 20, and in accordance with the specification, manufacturing conditions, and the like, an appropriate method is selected, for example, from direct forming methods including deposition methods, such as a CVD method, a sputtering method, and an E·B (electron beam) method, an ion plating method, a flame spraying method, and a spray method. In this step, the inorganic layer 20 is formed at a lower temperature than the temperature of a peeling step which will be described later.

Furthermore, the inorganic layer 20 is preferably formed in a reduced-pressure atmosphere. When the inorganic layer 20 is formed in a reduced-pressure atmosphere as described above, for example, generation of voids at the interface between the rear surface 12 of the piezoelectric single crystal substrate 1 and the inorganic layer 20 is prevented, so that the interface is dense. Accordingly, a highly reliable interface can be formed. In addition, since the interface can be stably and densely formed, for example, variations in reflection of an elastic wave at the above interface are prevented, and hence, besides an improvement in the characteristics of the elastic wave device, the stability of the characteristics thereof can also be improved.

Figure 3C:
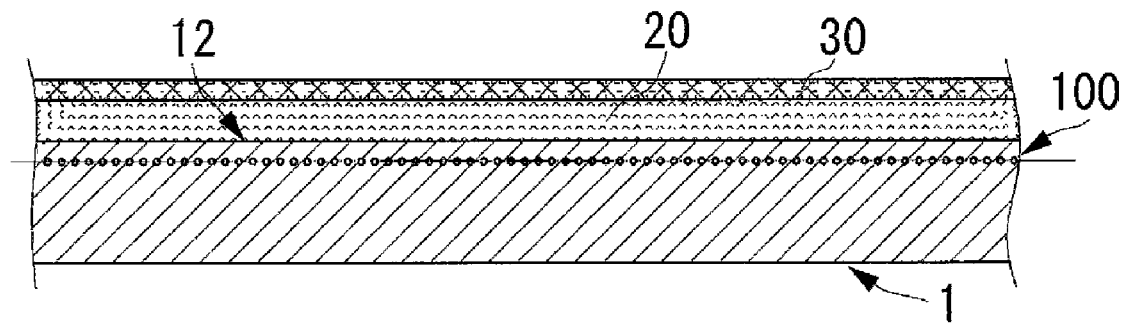

Next, as shown in FIG. 3C, the elastic layer 30 is formed on the surface of the inorganic layer 20 opposite to the piezoelectric single crystal substrate 1 (FIG. 2: S103). A material which satisfies a lower elastic modulus and a lower hardness than those of the inorganic layer 20 is used as a material for the elastic layer 30, and a material which further satisfies the heat conductivity and the coefficient of linear expansion described above is more preferably used.

A method for forming the elastic layer 30 is, for example, a coating method, and in more particular, as the coating method, a spin coating method, a spray coating method, and a dispensing method are more preferably used. In this step, the coating thickness is appropriately set in accordance with characteristics required as the elastic layer 30 and an intrinsic elastic modulus of the material.

Figure 3D:
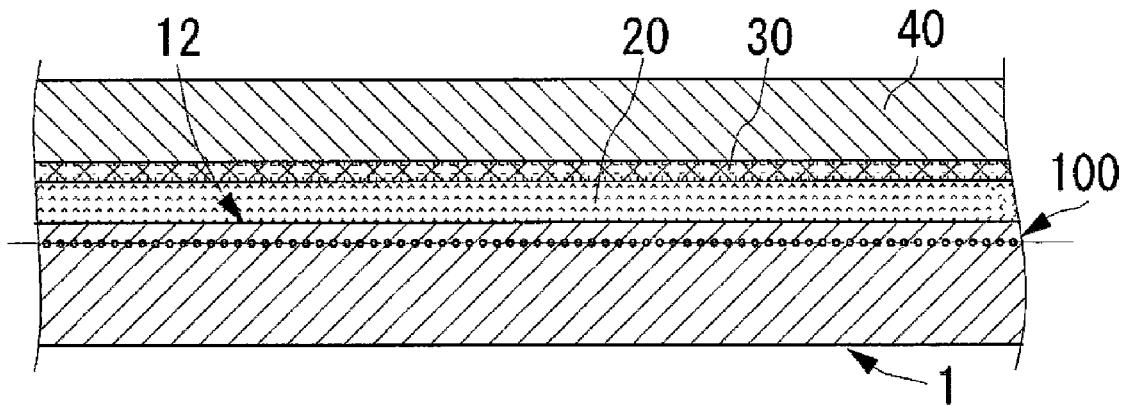

Next, as shown in FIG. 3D, the support member 40 is laminated to the surface of the elastic layer 30 opposite to the inorganic layer 20 (FIG. 2: S104). In this step, the laminating is preferably performed in a reduced-pressure atmosphere. Since the laminating is performed in a reduced-pressure atmosphere as described above, generation of voids at an adhesion interface between the elastic layer 30 and the support member 40 is prevented. Accordingly, a highly reliable elastic wave device can be formed.

Figure 4A:
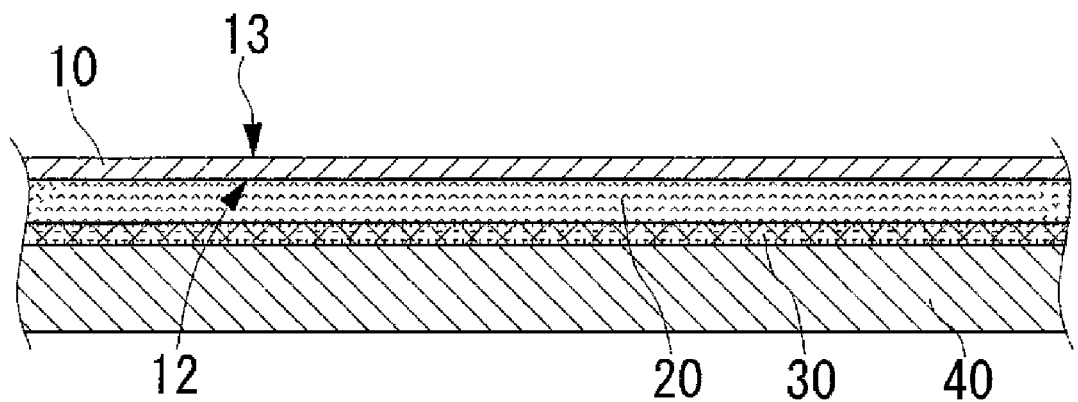
FIGS. 4A-4C include schematic views each showing a step of manufacturing the elastic wave device formed by the manufacturing flow shown in FIG. 2.

Next, as shown in FIG. 4A, a composite piezoelectric substrate in which the inorganic layer 20, the elastic layer 30, and the support member 40 are provided on the piezoelectric single crystal substrate 1 is heated, and peeling is performed using the ion-implanted layer 100 as a peeling surface (FIG. 2: S105). As a result, the piezoelectric thin film 10 supported by the support member 40 and provided with the inorganic layer 20 and the elastic layer 30 is formed. In this step, the heating temperature can be decreased if heating is performed in a reduced-pressure atmosphere.

Next, although not shown in the figure, the surface 13 of the piezoelectric thin film 10 formed by peeling is polished, for example, by a CMP method for planarization preferably to have a surface roughness Ra of about 1 nm or less. Accordingly, the characteristics of the elastic wave device can be improved.

Next, although not shown in the figure, polarization electrodes are formed on top and bottom surfaces of a composite piezoelectric substrate formed of the piezoelectric thin film 10, the inorganic layer 20, the elastic layer 30, and the support member 40, and a polarization step is performed by applying a predetermined voltage, thereby recovering the piezoelectricity of the piezoelectric thin film 10.

Figure 4B:
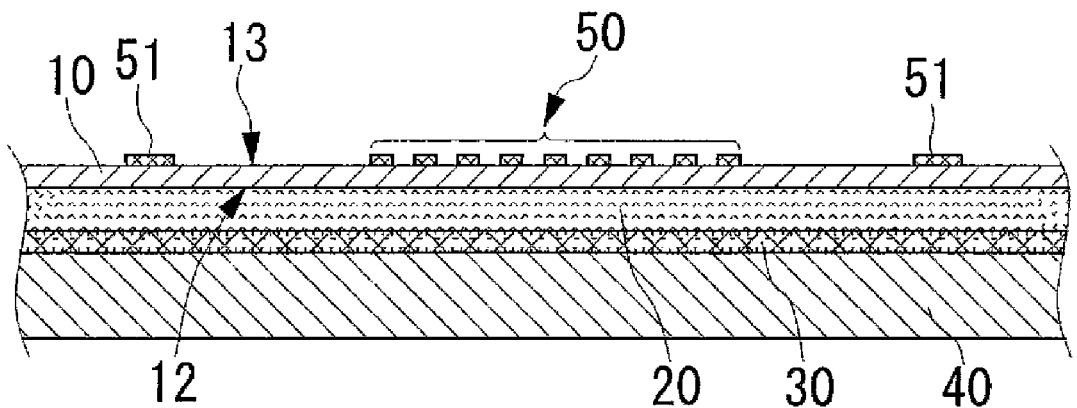
Figure 4C:
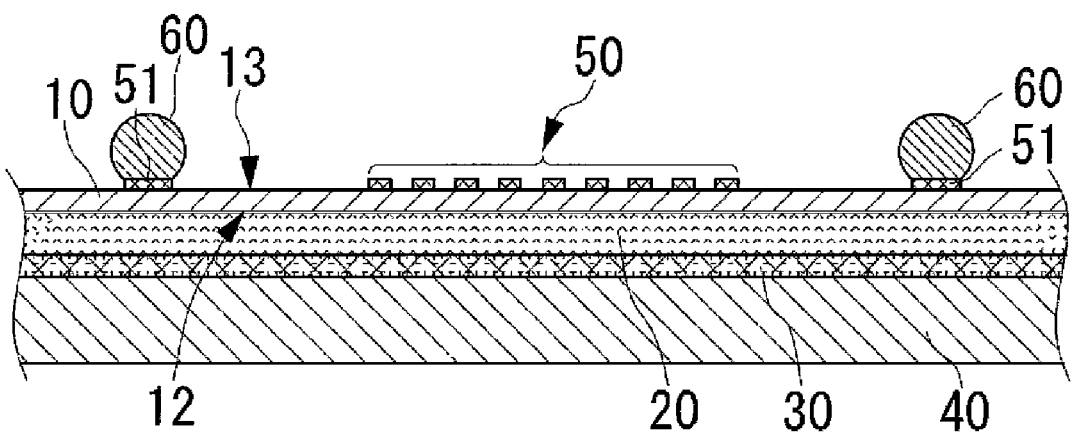

Next, as shown in FIG. 4B, for driving as the elastic wave device, the IDT electrode 50 and an upper electrode pattern of the bump pads 51 and the like are formed on the surface 13 of the piezoelectric thin film 10. In addition, as shown in FIG. 4C, for example, the bumps 60 are formed on the respective bump pads 51, so that an upper electrode pattern is formed (FIG. 2: S106). As described above, the elastic wave device is formed.

By using the manufacturing method as described above, an elastic wave device which has high reliability and excellent characteristics and which has a laminate structure formed of the piezoelectric thin film 10, the inorganic layer 20, the elastic layer 30, and the support member 40 can be manufactured without increasing the process load.

Next, a method for manufacturing an elastic wave device according to a second preferred embodiment will be described with reference to the drawings. Since an elastic wave device according to this preferred embodiment is formed by a manufacturing method including characteristic steps, and the structure of the elastic wave device finally obtained is the same as the elastic wave device according to the first preferred embodiment, the structural description is omitted. In addition, in the manufacturing method, the characteristic steps will only be described, and description of the same steps as those of the first preferred embodiment will be simplified.

Figure 5:
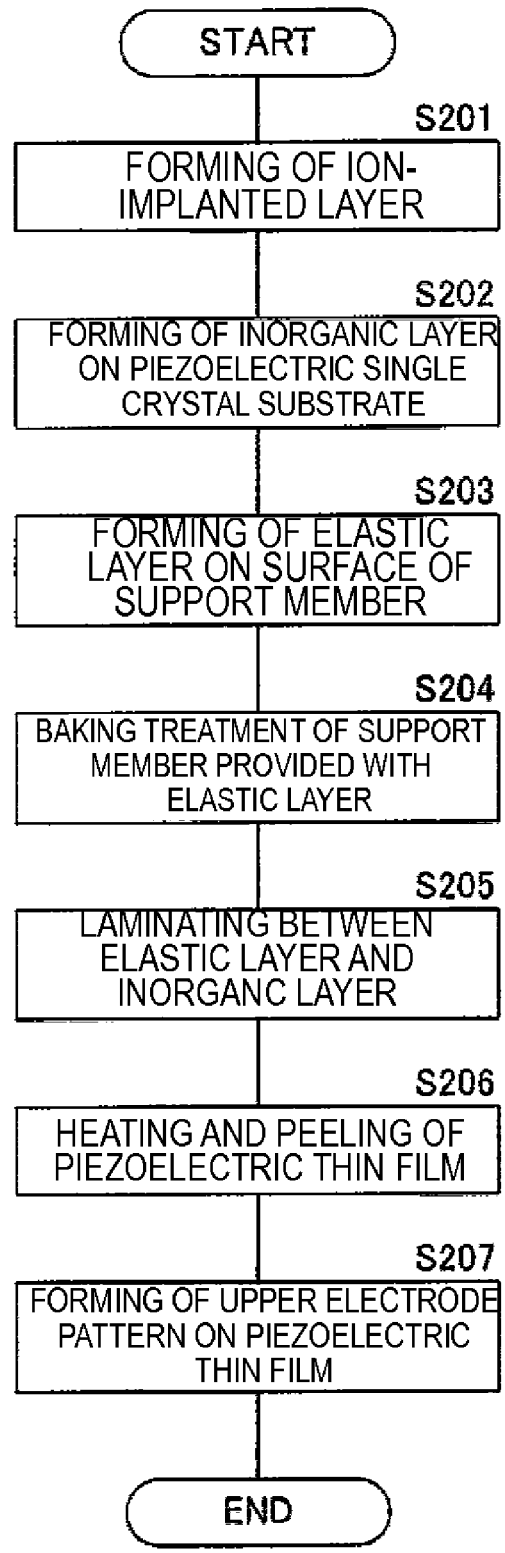
FIG. 5 is a flowchart showing a method for manufacturing an elastic wave device according to a second preferred embodiment of the present invention.
Figure 6A:
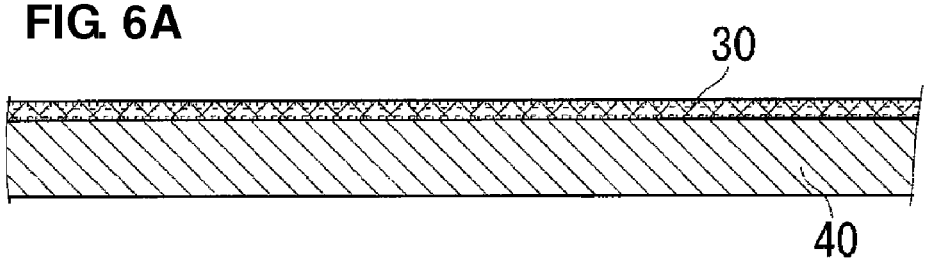
FIGS. 6A-6C include schematic views each showing a characteristic step of manufacturing the elastic wave device formed by the manufacturing flow shown in FIG. 5 which is different from that of the first preferred embodiment of the present invention.

FIG. 5 is a flowchart showing the method for manufacturing an elastic wave device according to the present preferred embodiment. FIGS. 6A-4C include schematic views each showing a characteristic step in a manufacturing process of the elastic wave device formed by the manufacturing flow shown in FIG. 5 which is different from that of the first preferred embodiment.

As shown in FIG. 5, a step of forming the ion-implanted layer 100 in the piezoelectric single crystal substrate 1 and a step of forming the inorganic layer 20 on the piezoelectric single crystal substrate 1 (FIGS. 5: S201 and S202) are preferably the same as those of the first preferred embodiment.

Besides the steps described above, as shown in FIG. 6A, the elastic layer 30 is formed on the surface of the support member 40 (FIG. 5: S203). A material and a formation method of the elastic layer 30 are preferably the same as those of the first preferred embodiment.

Next, a baking treatment is performed on the support member 40 provided with the elastic layer 30 (second composite layer) at a predetermined temperature (FIG. 5: S204). For example, when an elastic wave device to be used at a service temperature of about 300° C. or more is manufactured, the baking treatment is performed at a temperature obtained by adding a predetermined margin to this service temperature. When the baking treatment as described above is performed, in an atmosphere at a temperature higher than that to be reached in the manufacturing method and the use environment of the elastic wave device according to the first preferred embodiment, such as in an atmosphere at about 300° C. or more, a solvent and the like are removed from the elastic layer 30 during the baking treatment. Hence, an annealing treatment in accordance with the use conditions is performed, and degradation in characteristics of the elastic wave device can be prevented during the use thereof.

The baking treatment as described above cannot be carried out by the manufacturing method according to the first preferred embodiment. The reason for this is that when heat at a temperature of about 300° C. or more is applied to the composite piezoelectric substrate formed of the piezoelectric single crystal substrate 1, the inorganic layer 20, and the elastic layer 30, the piezoelectric single crystal substrate 1 is partially peeled away at the ion-implanted layer 100, and thin film formation occurs. However, by using the manufacturing method according to this preferred embodiment, the piezoelectric thin film 10 is prevented from being formed by peeling before the peeling step.

Figure 6B:
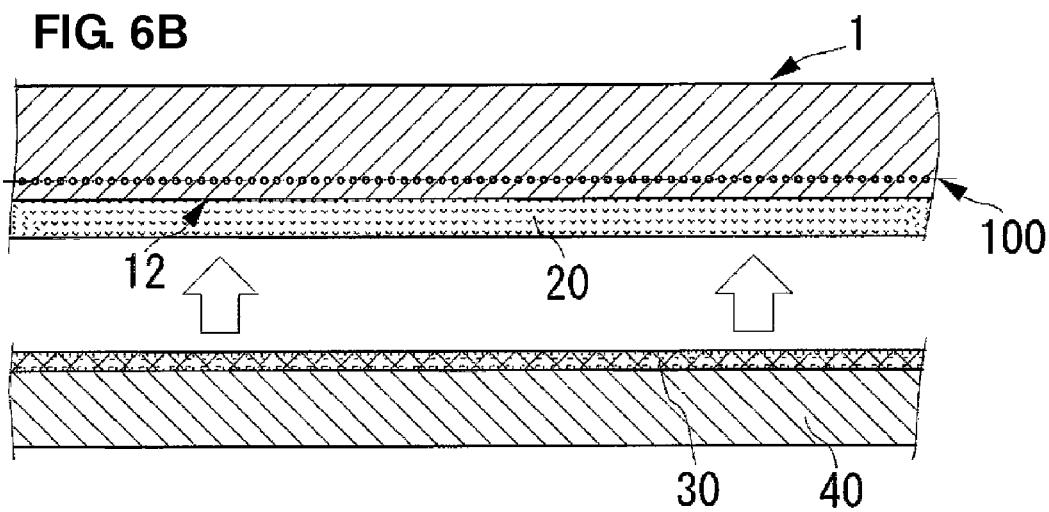
Figure 6C:
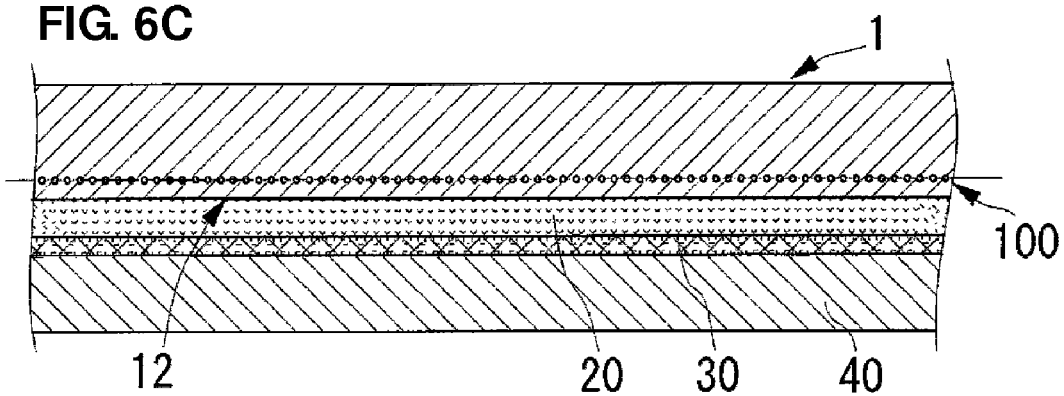

Next, as shown in FIGS. 6B and 6C, the elastic layer 30 formed on the support member 40 (second composite layer) and the inorganic layer 20 formed on the piezoelectric single crystal substrate 1 (first composite layer) are laminated to each other (FIG. 5: S205). The conditions of this laminating step may be the same as those of the first preferred embodiment.

Hereinafter, under the same conditions as those of the first preferred embodiment, the formation of the piezoelectric thin film (FIG. 5: S206) by heating and peeling and the formation of the upper electrode pattern (FIG. 5: S207) are performed.

As described above, when the manufacturing method of this preferred embodiment is used, an elastic wave device formed by a process flow at a temperature of about 300° C. or more can be surely manufactured while high reliability and excellent characteristics thereof are maintained.

In addition, in the above preferred embodiments, although the surface acoustic wave device has been described by way of example, the structure and the manufacturing method according to various preferred embodiments of the present invention may also be applied to other piezoelectric devices each using a piezoelectric thin film.

Figure 7:
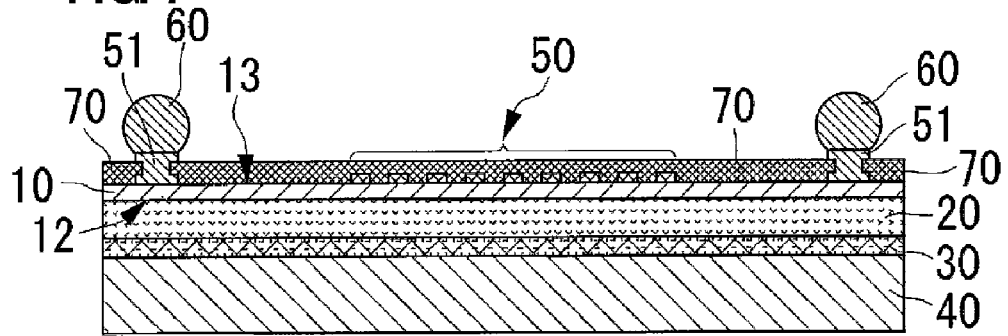
FIG. 7 includes a side cross-sectional view showing the structure of an elastic boundary wave device in which a dielectric layer is formed at a surface side and which uses the mode of a wave generated around an interface with a piezoelectric thin film.

In addition, although the case in which only the upper electrode pattern is formed on the surface 13 of the piezoelectric thin film 10 has been described above by way of example, the structure and the manufacturing method described above can be applied even to a piezoelectric device in which an insulating material layer is further formed on a piezoelectric thin film. For example, FIG. 7 includes a side cross-sectional view showing the structure of an elastic boundary wave device in which a dielectric layer is formed at a surface 13 side and which uses the mode of a wave generated around an interface with a piezoelectric thin film. As shown in FIG. 7, when the dielectric layer is formed, a dielectric layer 70 having a predetermined thickness is formed on the surface 13 of the piezoelectric thin film 10 on which the IDT electrode 50 is formed. In this case, the IDT electrode 50 is formed so as to be covered with the dielectric layer 70, and the bump pads 51 are formed so as to be exposed from the dielectric layer 70.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave device comprising:
 a piezoelectric thin film on which an IDT electrode is provided;
 a support member provided at a side of one primary surface of the piezoelectric thin film;

an inorganic layer provided on the one primary surface of the piezoelectric thin film; and an elastic layer provided on a surface of the inorganic layer opposite to the piezoelectric thin film, the inorganic layer and the elastic layer being provided between the piezoelectric thin film and the support member; wherein the inorganic layer is made of a material having a higher elastic modulus and a higher hardness than those of the elastic layer.

2. The elastic wave device according to claim 1, wherein the elastic layer contains an inorganic filler.

3. The elastic wave device according to claim 1, wherein the inorganic layer has a higher heat conductivity than that of the piezoelectric thin film.

4. The elastic wave device according to claim 1, wherein the elastic layer has a higher heat conductivity than that of each of the piezoelectric thin film and the inorganic layer.

5. The elastic wave device according to claim 1, wherein the inorganic layer has a lower coefficient of linear expansion than that of the piezoelectric thin film.

6. The elastic wave device according to claim 1, wherein the piezoelectric thin film includes a material containing a Group I element.

7. A method for manufacturing the elastic wave device according to claim 1 comprising:

an ion implantation step of implanting ions into a piezoelectric substrate to form an ion-implanted layer;

an inorganic layer formation step of directly forming the inorganic layer on one primary surface of the piezoelectric substrate at an ion-implanted layer side;

an elastic layer disposing step of disposing the elastic layer on a surface of the inorganic layer opposite to the piezoelectric substrate;

a laminating step of laminating the support member to the elastic layer; and a peeling step of forming the piezoelectric thin film from the piezoelectric substrate in which the ion-implanted layer is formed by peeling.

8. A method for manufacturing the elastic wave device according to claim 1 comprising:

an ion implantation step of implanting ions into a piezoelectric substrate to form an ion-implanted layer;

an inorganic layer formation step of directly forming the inorganic layer on a primary surface of the piezoelectric substrate at an ion-implanted layer side;

an elastic layer disposing step of disposing the elastic layer on a surface of the support member;

a laminating step of laminating the inorganic layer to the elastic layer; and a peeling step of forming the piezoelectric thin film from the piezoelectric substrate in which the ion-implanted layer is formed by peeling.

9. The method according to claim 7, wherein the laminating step is performed in a reduced-pressure atmosphere.

10. The method according to claim 7, wherein the inorganic layer formation step is performed in a reduced-pressure atmosphere.

* * * * *